(12) United States Patent
Kushida

(10) Patent No.: US 8,223,570 B2
(45) Date of Patent: Jul. 17, 2012

(54) SEMICONDUCTOR STORAGE DEVICE WITH BIT LINE PRE-CHARGE CIRCUIT

(75) Inventor: Keiichi Kushida, Tokyo (JP)

(73) Assignee: Kabushiki Kaisha Toshiba (JP)

( * ) Notice: Subject to any disclaimer, the term of this patent is extended or adjusted under 35 U.S.C. 154(b) by 393 days.

(21) Appl. No.: 12/552,933

(22) Filed: Sep. 2, 2009

(65) Prior Publication Data

US 2010/0238749 A1 Sep. 23, 2010

(30) Foreign Application Priority Data

Mar. 18, 2009 (JP) ................................ 2009-066369

(51) Int. Cl.
*G11C 7/02* (2006.01)
(52) U.S. Cl. ...... 365/207; 365/203; 365/208; 365/230.06
(58) Field of Classification Search .................. 365/203, 365/207, 208, 230.06
See application file for complete search history.

(56) References Cited

U.S. PATENT DOCUMENTS

| 5,023,841 | A |   | 6/1991  | Akrout et al.            |
|-----------|---|---|---------|--------------------------|
| 5,546,346 | A | * | 8/1996  | Agata et al. ..... 365/203 |
| 5,831,910 | A | * | 11/1998 | Suzuki et al. ..... 365/189.11 |
| 6,324,111 | B1| * | 11/2001 | Sato et al. ..... 365/207 |
| 7,864,608 | B2| * | 1/2011  | Takahashi ..... 365/207   |

FOREIGN PATENT DOCUMENTS

| JP | 02-010593   | 1/1990  |
|----|-------------|---------|
| JP | 09-282890   | 10/1997 |
| JP | 11-288592   | 10/1999 |
| JP | 11-317099   | 11/1999 |
| JP | 2001-155489 | 6/2001  |
| JP | 2005-158096 | 6/2005  |

OTHER PUBLICATIONS

Hirabayashi et al. "A Process-Variation-Tolerant Dual-Power-Supply SRAM with 0.179μm2 Cell in 40nm CMOS Using Level-Programmable Wordline Driver" ISSCC Dig. Tech. Papers pp. 458-459 Feb. 2009.
Explanation of Non-English Language Reference(s).
Japanese Office Action for Japanese Application No. 2009-066369, mailed Jul. 12, 2011, in 5 pages.

* cited by examiner

*Primary Examiner* — VanThu Nguyen
(74) *Attorney, Agent, or Firm* — Knobbe, Martens, Olson & Bear LLP

(57) ABSTRACT

In one embodiment, a semiconductor storage device includes a memory cell, a sense amplifier, a bit line, a pre-charge circuit, and a power-supply-voltage switching circuit. The memory cell is configured to store data. The sense amplifier is configured to amplify a signal from the memory cell. The bit line is configured to transmit the signal from the memory cell to the sense amplifier. The pre-charge circuit is configured to pre-charge the bit line. The power-supply-voltage switching circuit is configured to switch a voltage of a power supply and to actuate the sense amplifier after the bit line is pre-charged by the pre-charge circuit, wherein the power-supply-voltage switching circuit is configured to switch the voltage of the power supply to be larger than a voltage during the pre-charge by the pre-charge circuit.

18 Claims, 5 Drawing Sheets

United States Patent US 8,223,570 B2

SEMICONDUCTOR STORAGE DEVICE WITH BIT LINE PRE-CHARGE CIRCUIT

CROSS-REFERENCE TO RELATED APPLICATIONS

This application is based upon and claims the benefit of priority from the prior Japanese Patent Application No. 2009-66369, filed on Mar. 18, 2009; the entire contents of which are incorporated herein by reference.

BACKGROUND OF THE INVENTION

1. Field of the Invention

The present invention relates to a semiconductor storage device, and, more particular, is suitably applied to a method of realizing a reduction in power consumption of an SRAM by using power supplies that generate a plurality of voltages.

2. Description of the Related Art

According to the progress in reduction of power consumption of system LSIs in recent years, a reduction in power consumption of SRAMs are also in progress. As a method of reducing power consumption of an SRAM, there is a method of using a high-voltage power supply only for SRAM cells and a part of word line control circuit and using a low-voltage power supply for other circuits. A high power reduction effect can be obtained by this method because the voltage of a voltage power supply for bit lines can be reduced.

For example, Japanese Patent Application Laid-Open No. H9-282890 discloses a method of boosting a first voltage applied to an SRAM to a higher second voltage to actuate a memory cell array and a decoder with the first voltage and actuate a sense amplifier with the second voltage.

However, in the method of reducing the voltage of a voltage power supply for bit lines to realize a reduction in power consumption of an SRAM, because a pre-charge power supply has to be shared with a sense amplifier connected to the bit lines, a voltage power supply for the sense amplifier is also reduced in voltage. Therefore, sensing speed of the sense amplifier substantially drops to cause a reduction in speed of the SRAM.

In the method disclosed in Japanese Patent Application Laid-Open No. H9-282890, because a high-voltage power supply is used for the sense amplifier, a voltage power supply for bit lines connected to the sense amplifier is also increased in voltage to cause an increase in power consumption.

BRIEF SUMMARY OF THE INVENTION

A semiconductor storage device according to an embodiment of the present invention comprises: a memory cell that stores data; a sense amplifier that amplifies a signal read out from the memory cell; a bit line that transmits the signal read out from the memory cell to the sense amplifier; a pre-charge circuit that pre-charges the bit line; and a power-supply-voltage switching circuit that switches, after the bit line is pre-charged by the pre-charge circuit, a voltage of a power supply for actuating the sense amplifier.

A semiconductor storage device according to an embodiment of the present invention comprises: a memory cell that stores data; a local sense amplifier that amplifies a signal read out from the memory cell; a bit line that transmits the signal read out from the memory cell to the local sense amplifier; a first pre-charge circuit that pre-charges the bit line; a global bit line that transmits the signal amplified by the local sense amplifier; a second pre-charge circuit that pre-charges the global bit line; a global sense amplifier that amplifies the signal transmitted by the global bit line; a driving circuit that drives the global bit line based on the signal amplified by the local sense amplifier; and a power-supply-voltage switching circuit that switches, after the global bit line is pre-charged by the second pre-charge circuit, a voltage of a power supply for actuating the driving circuit.

A semiconductor storage device according to an embodiment of the present invention comprises: a memory cell that stores data; a local sense amplifier that amplifies a signal read out from the memory cell; a bit line connected to the memory cell; a sense bit line that transmits a signal read out to the bit line to the local sense amplifier; a first pre-charge circuit that pre-charges the bit line; a second pre-charge circuit that pre-charges the sense bit line; a global bit line that transmits the signal amplified by the local sense amplifier; a third pre-charge circuit that pre-charges the global bit line; a global sense amplifier that amplifies the signal transmitted by the global bit line; a driving circuit that drives the global bit line based on the signal amplified by the local sense amplifier; and a power-supply-voltage switching circuit that switches, after the sense bit line is pre-charged by the second pre-charge circuit, a voltage of a power supply for actuating the local sense amplifier.

DETAILED DESCRIPTION OF THE INVENTION

Exemplary embodiments of the present invention are explained in detail below with reference to the accompanying drawings. The present invention is not limited by the embodiments.

Figure 1:
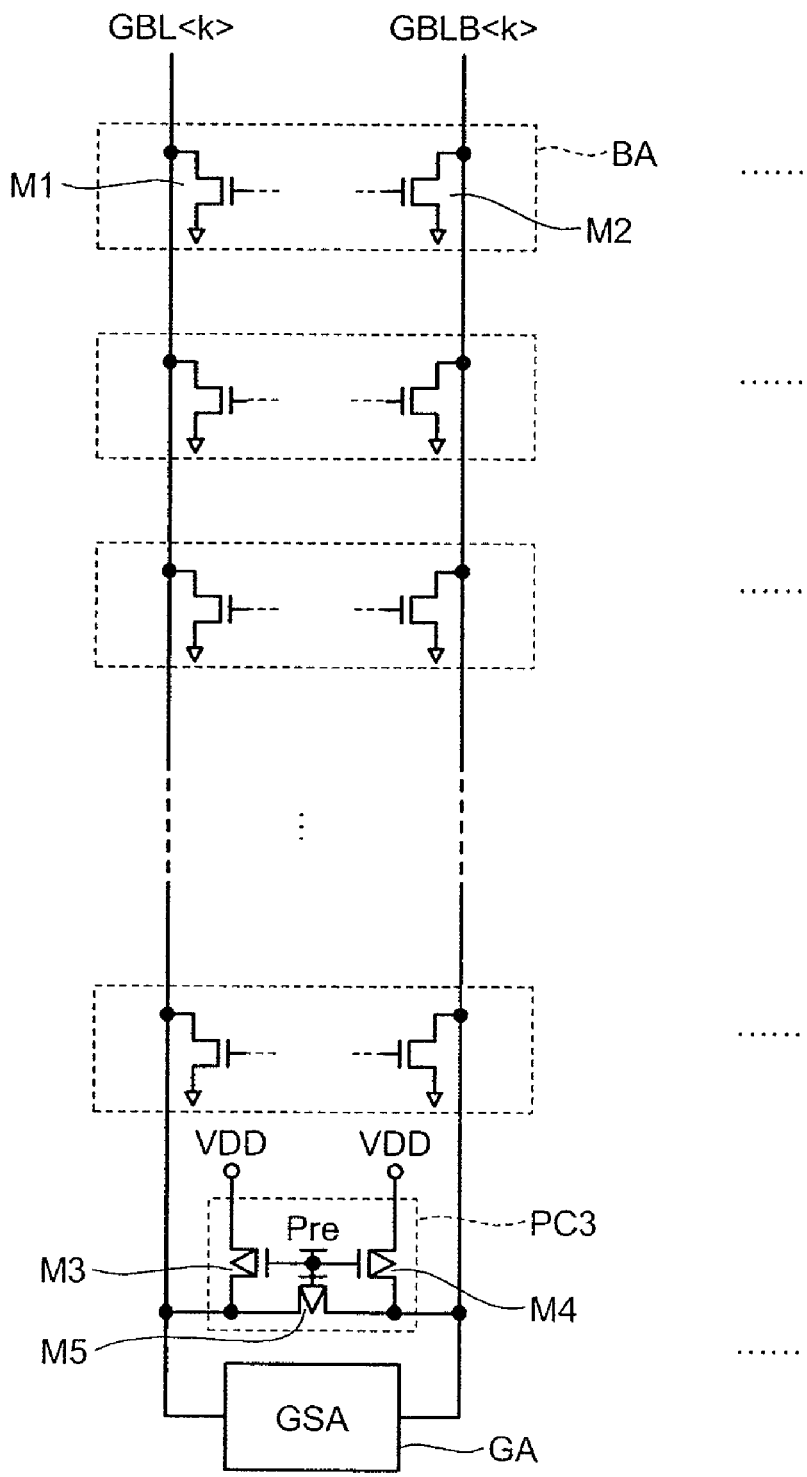
FIG. 1 is a block diagram of a schematic configuration of a semiconductor storage device according to a first embodiment of the present invention.
Figure 2:
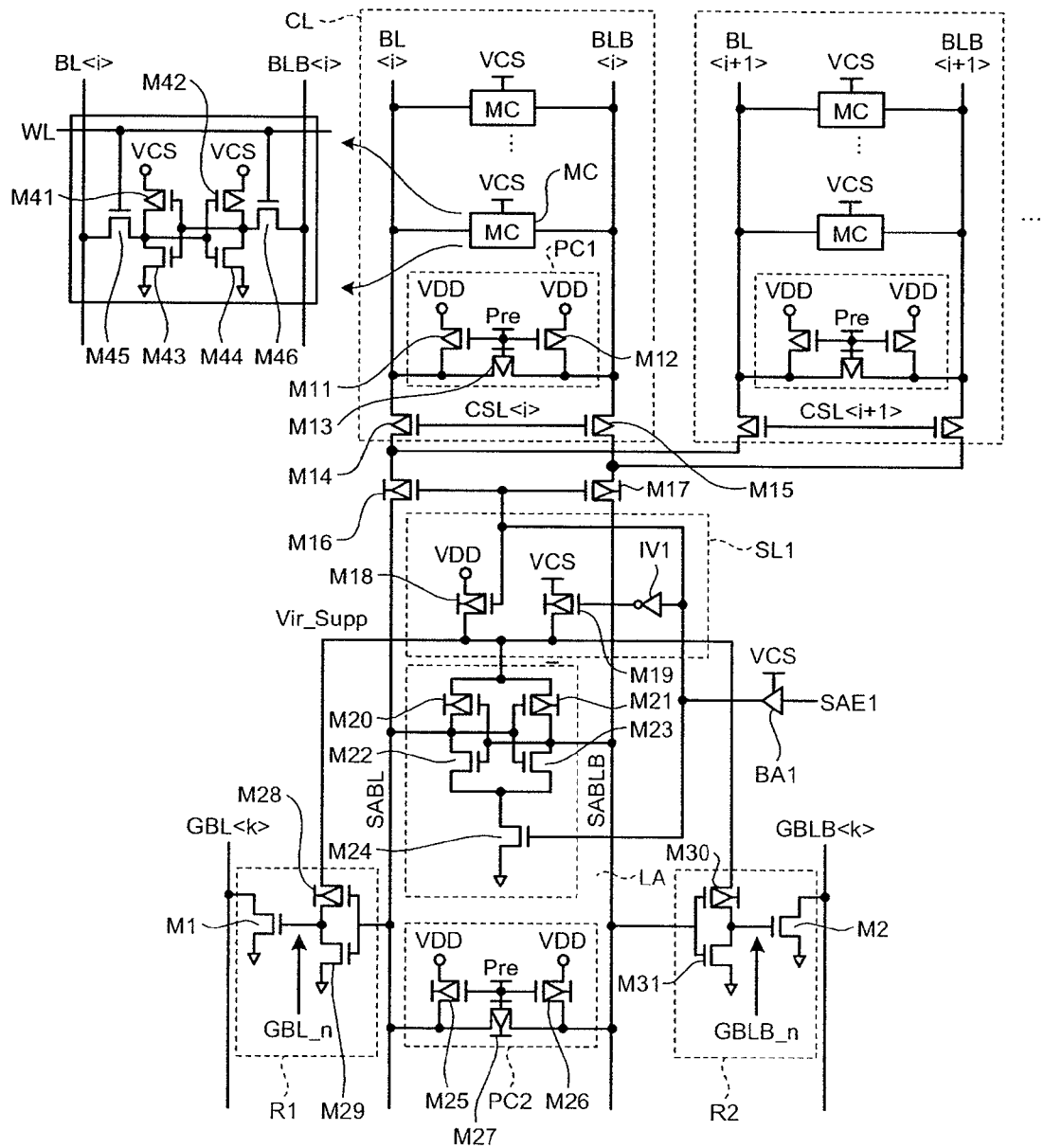
FIG. 2 is a block diagram of a schematic configuration of a bank BA shown in FIG. 1.

FIG. 1 is a block diagram of a schematic configuration of a semiconductor storage device according to a first embodiment of the present invention. FIG. 2 is a block diagram of a schematic configuration of a bank BA shown in FIG. 1.

In FIG. 2, memory cells MC, each of which stores data for one bit, are provided in the semiconductor storage device. The memory cells MC are arrayed in a matrix shape in a row direction and a column direction.

In each of the memory cells MC, P-channel field effect transistors (hereinafter, "P-ch transistors") M41 and M42 and N-channel field effect transistors (hereinafter, "N-ch transistors") M43 to M46 are provided. The P-ch transistor M41 and the N-ch transistor M43 are connected in series and a gate of the P-ch transistor M41 and a gate of the N-ch transistor M43 are connected to each other to form an inverter. The P-ch transistor M42 and the N-ch transistor M44 are connected in series and a gate of the P-ch transistor M42 and a gate of the N-ch transistor M44 are connected to each other to form an inverter. An output of one of the pair of inverters is connected to an input of the other inverter to form a flip-flop.

The gate of the P-ch transistor M41, the gate of the N-ch transistor M43, a drain of the P-ch transistor, and a drain of the N-ch transistor M44 are connected to a bit line BL<i> via the N-ch transistor M45. The gate of the P-ch transistor M42, the gate of the N-ch transistor M44, a drain of the P-ch transistor M41, and a drain of the N-ch transistor M43 are connected to a bit line BLB<i> via the N-ch transistor M46.

A gate of the N-ch transistor M45 and a gate of the N-ch transistor M46 are connected to a word line WL.

High-voltage power supplies VCS are used as power supplies for actuating the memory cells MC. Sources of the P-ch transistors M41 and M42 are connected to the high-voltage power supplies VCS.

With the bit lines BL<i> and BLB<i> set as a pair, a cluster CL is formed by a plurality of memory cells MC in the column direction connected to the bit lines BL<i> and BLB<i>. Bit lines BL<i+1> and BLB<i+1> are arranged beside the bit lines BL<i> and BLB<i>, whereby clusters CL are arrayed in the row direction. As shown in FIG. 1, banks BA are formed by the clusters CL arrayed in the row direction. The banks BA are arrayed in the column direction and the row direction. A pair of global bit lines GBL<k> and GBLB<k> are provided in common to a plurality of banks BA arrayed in the column direction.

In each of the clusters CL, as shown in FIG. 2, a pre-charge circuit PC1 that pre-charges the bit lines BL<i> and BLB<i> of the cluster CL is provided. P-ch transistors M11 to M13 are provided in the pre-charge circuit PC1. Gates of the P-ch transistors M11 to M13 are connected to one another. The P-ch transistor M13 is connected between the bit lines BL<i> and BLB<i>. A drain of the P-ch transistor M11 is connected to the bit line BL<i>. A drain of the P-ch transistor M12 is connected to the bit line BLB<i>.

A low-voltage power supply VDD is used as a power supply for actuating the pre-charge circuit PC1. Sources of the P-ch transistors M11 and M12 are connected to the low-voltage power supply VDD. The low-voltage power supply VDD is set to a voltage lower than that of the high-voltage power supply VCS. P-ch transistors M14 and M15 that select the cluster CL from the banks BA are provided at a post stage of the pre-charge circuit PC1. The P-ch transistor M14 is inserted in the bit line BL<i>. The P-ch transistor M15 is inserted in the bit line BLB<i>. A gate of the P-ch transistor M14 and a gate of the P-ch transistor M15 are connected to each other.

The bit lines BL<i>, BLB<i>, BL<i+1>, BLB<i+1>, ... of the clusters CL are respectively connected to sense bit lines SABL and SABLB via the P-ch transistors M16 and M17.

A local sense amplifier LA that amplifies signals read out from the memory cells MC and a pre-charge circuit PC2 that pre-charges the sense bit lines SABL and SABLB are connected to the sense bit lines SABL and SABLB.

P-ch transistors M20 and M21 and N-ch transistors M22 to M24 are provided in the local sense amplifier LA. The P-ch transistor M20 and the N-ch transistor M22 are connected in series and a gate of the P-ch transistor M20 and a gate of the N-ch transistor M22 are connected to each other to form an inverter. The P-ch transistor M21 and the N-ch transistor M23 are connected in series and a gate of the P-ch transistor M21 and a gate of the N-ch transistor M23 are connected to each other to form an inverter. An output of one of the pair of inverters is connected to an input of the other inverter to form a flip-flop.

The gate of the P-ch transistor M21, the gate of the N-ch transistor M23, a drain of the P-ch transistor M20, and a drain of the N-ch transistor 22 are connected to the sense bit line SABL. The gate of the P-ch transistor M20, the gate of the N-ch transistor M22, a drain of the P-ch transistor M21, and a drain of the N-ch transistor M23 are connected to the sense bit line SABLB. Sources of the N-ch transistors M22 and M23 are connected to a drain of the N-ch transistor M24.

P-ch transistors M25 to M27 are provided in the pre-charge circuit PC2. Gates of the P-ch transistors M25 to M27 are connected to one another. The P-ch transistor M27 is connected between the sense bit lines SABL and SABLB. A drain of the P-ch transistor M25 is connected to the sense bit line SABL. A drain of the P-ch transistor M26 is connected to the sense bit line SABLB.

The low-voltage power supply VDD is used as a power supply for actuating the pre-charge circuit PC2. Sources of the P-ch transistors M25 and M26 are connected to the low-voltage power supply VDD.

The sense bit lines SABL and SABLB are connected to global bit lines GBL<k> and GBLB<k> via driving circuits R1 and R2, respectively.

The driving circuits R1 and R2 can drive the global bit lines GBL<k> and GBLB<k>, respectively, based on a signal amplified by the local sense amplifier LA. A P-ch transistor M28 and N-ch transistors M1 and M29 are provided in the driving circuit R1. The P-ch transistor M28 and the N-ch transistor M29 are connected in series and a gate of the P-ch transistor M28 and a gate of the N-ch transistor M29 are connected to each other to form an inverter.

The gate of the P-ch transistor M28 and the gate of the N-ch transistor M29 are connected to the sense bit line SABL. A drain of the P-ch transistor M28 and a drain of the N-ch transistor M29 are connected to a gate of the N-ch transistor M1. A drain of the N-ch transistor M1 is connected to the global bit line GBL<k>.

A P-ch transistor M30 and N-ch transistors M2 and M31 are provided in the driving circuit R2. The P-ch transistor M30 and the N-ch transistor M31 are connected in series and a gate of the P-ch transistor M30 and a gate of the N-ch transistor M31 are connected to each other to form an inverter.

The gate of the P-ch transistor M30 and the gate of the N-ch transistor M31 are connected to the sense bit line SABLB. A drain of the P-ch transistor M30 and a drain of the N-ch transistor M31 are connected to a gate of the N-ch transistor M2. A drain of the N-ch transistor M2 is connected to the global bit line GBLB<k>.

As shown in FIG. 1, a global sense amplifier GA that amplifies signals transmitted through the global bit lines GBL<k> and GBLB<k> and a pre-charge circuit PC3 that pre-charges the global bit lines GBL<k> and GBLB<k> are connected to the global bit lines GBL<k> and GBLB<k>.

P-ch transistors M3 to M5 are provided in the pre-charge circuit PC3. Gates of the P-ch transistors M3 to M5 are connected to one another. A P-ch transistor M5 is connected between the global bit lines GBL<k> and GBLB<k>. A drain of the P-ch transistor M3 is connected to the global bit line GBL<k> and a drain of the P-ch transistor M4 is connected to the global bit line GBLB<k>.

The low-voltage power supply VDD is used as a power supply for actuating the pre-charge circuit PC3. Sources of the P-ch transistors M3 and M4 are connected to the low-voltage power supply VDD.

In FIG. 2, a power-supply-voltage switching circuit SL1 that switches, after the sense bit lines SABL and SABLB are pre-charged by the pre-charge circuit PC2, the voltage of a power supply for actuating the local sense amplifier LA and the driving circuits R1 and R2 is provided in the semiconductor storage device. The power-supply-voltage switching circuit SL1 can supply the low-voltage power supply VDD to the local sense amplifier LA and the driving circuits R1 and R2 when a sense amplifier enable signal SAE1 for allowing the operation of the local sense amplifier LA is off. The power-supply-voltage switching circuit SL1 can supply the high-voltage power supply VCS to the local sense amplifier LA and the driving circuits R1 and R2 when the sense amplifier enable signal SAE1 is on.

P-ch transistors M18 and M19 and an inverter IV1 are provided in the power-supply-voltage switching circuit SL1. The low-voltage power supply VDD is connected to a source of the P-ch transistor M18. The high-voltage power supply VCS is connected to a source of the P-ch transistor M19. Drains of the P-ch transistors M18 and M19 are connected to drains of the P-ch transistors M20, M21, M28, and M30.

The sense amplifier enable signal SAE1 is input to gates of the P-ch transistors M16 to M18 and the N-ch transistor M24 via a buffer BA1. The sense amplifier enable signal SAE1 is input to a gate of the P-ch transistor M19 via the buffer BA1 and the inverter IV1.

Figure 3:
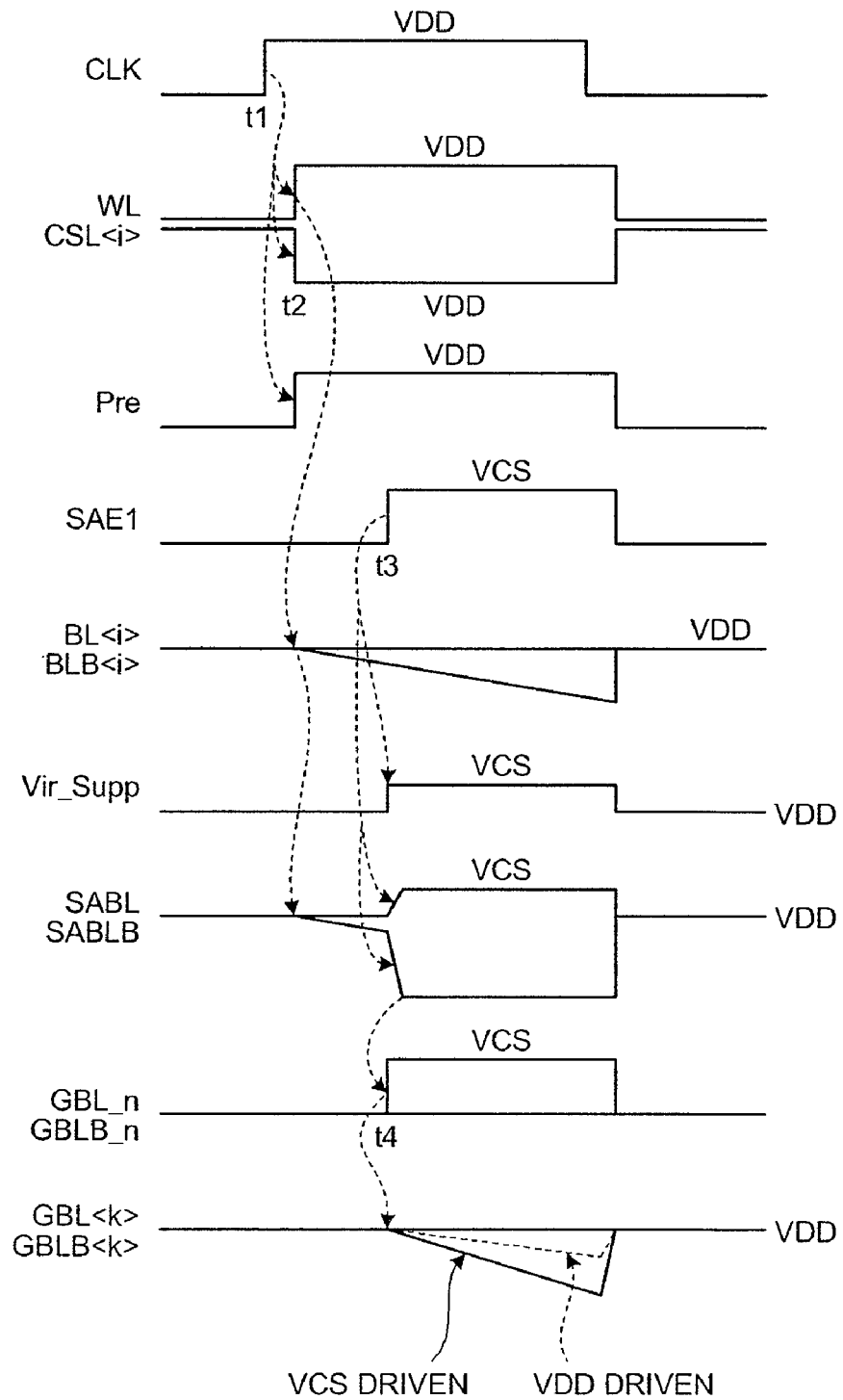
FIG. 3 is a timing chart of the operation of a local sense amplifier LA shown in FIG. 2.

FIG. 3 is a timing chart of the operation of the local sense amplifier LA shown in FIG. 2.

In FIG. 3, before data is read out from the memory cell MC shown in FIG. 2, a pre-charge signal Pre is maintained at a low level. When the pre-charge signal Pre is at the low level, the P-ch transistors M11 to M13 are turned on and the low-voltage power supply VDD is connected to the bit lines BL<i> and BLB<i>. The bit lines BL<i> and BLB<i> are pre-charged to increase potentials thereof to the voltage of the low-voltage power supply VDD.

When the pre-charge signal Pre is at the low level, the P-ch transistors M25 to M27 are turned on and the low-voltage power supply VDD is connected to the sense bit lines SABL and SABLB. The sense bit lines SABL and SABLB are pre-charged to increase potentials thereof to the voltage of the low-voltage power supply VDD.

When the pre-charge signal Pre is at the low level, the P-ch transistors M3 to M5 shown in FIG. 1 are turned on and the low-voltage power supply VDD is connected to the global bit lines GBL<k> and GBLB<k>. The global bit lines GBL<k> and GBLB<k> are pre-charged to increase potentials thereof to the voltage of the low-voltage power supply VDD.

Before data is read out from the memory cell MC, the sense amplifier enable signal SAE1 is maintained at the low level. When the sense amplifier enable signal SAE1 is maintained at the low level, the N-ch transistor M24 is turned off, the operation of the local sense amplifier LA is stopped, and the P-ch transistors M16 and M17 are turned on. The signal read out from the memory cell MC is maintained to be capable of being transmitted to the sense bit lines SABL and SABLB via the bit lines BL<i> and BLB<i>.

When the sense amplifier enable signal SAE1 is maintained at the low level, the P-ch transistor M18 is turned on, the sense amplifier enable signal SAE1 is inverted by the inverter IV1, and the P-ch transistor M19 is turned off. Therefore, a power supply voltage Vir_supp output from the power-supply-voltage switching circuit SL1 is switched to the low-voltage power supply VDD and the low-voltage power supply VDD is supplied to the P-ch transistors M20, M21, M28, and M30. Consequently, the local sense amplifier LA and the driving circuits R1 and R2 are actuated by the low-voltage power supply VDD.

When data is read out from the memory cell MC shown in FIG. 2, a clock signal CLK changes from the low level to a high level (time t1). When the clock signal CLK changes from the low level to the high level, the pre-charge signal Pre changes from the low level to the high level and the P-ch transistors M11 to M13, M25 to M27, and M3 to M5 are turned off.

When the P-ch transistors M11 to M13 are turned off, the pre-charge of the bit lines BL<i> and BLB<i> is stopped. When the P-ch transistors M25 to M27 are turned off, the pre-charge of the sense bit lines SABL and SABLB is stopped. When the P-ch transistors M3 to M5 are turned off, the pre-charge of the global bit lines GBL<k> and GBLB<k> is stopped.

When the clock signal CLK changes from the low level to the high level, the potential on the word line WL shown in FIG. 2 changes from the low level to the high level (time t2). When the potential on the word line WL changes from the low level to the high level, the N-ch transistors M45 and M46 are turned on. One of the bit lines BL<i> and BLB<i> is discharged according to data stored in the memory cell MC. The potential on one of the bit lines BL<i> and BLB<i> drops.

When the clock signal CLK changes from the low level to the high level, a cluster selection signal CSL<i> changes from the high level to the low level. The bit lines BL<i> and BLB<i> are selected out of the bit lines BL<i>, BLB<i>, BL<i+1>, BLB<i+1>, . . . to which the sense bit lines SABL and SABLB are connected.

The potentials on the bit lines BL<i> and BLB<i> are transmitted to the sense bit lines SABL and SABLB via the P-ch transistors M14 to M17. The potential on one of the sense bit lines SABL and SABLB also drops according to the drop in the potential on one of the bit lines BL<i> and BLB<i>.

For example, after the elapse of a predetermined time from the start of discharge of the bit line BLB<i>, the sense amplifier enable signal SAE1 changes from the low level to the high level (time t3). When the sense amplifier enable signal SAE1 changes from the low level to the high level, the N-ch transistor M24 is turned on and the local sense amplifier LA is actuated. The P-ch transistors M16 and M17 are turned off and the bit lines BL<i> and BLB<i> and the sense bit lines SABL and SABLB are disconnected.

When the sense amplifier enable signal SAE1 changes from the low level to the high level, the P-ch transistor M18 is turned off, the sense amplifier enable signal SAE1 is inverted by the inverter IV1, and the P-ch transistor M19 is turned on. Therefore, the power supply voltage Vir_Supp output from the power-supply-voltage switching circuit SL1 is switched to the high-voltage power supply VCS. The high-voltage power supply VCS is supplied to the P-ch transistors M20, M21, M28, and M30. The local sense amplifier LA and the driving circuits R1 and R2 are actuated by the high-voltage power supply VCS.

When the local sense amplifier LA is actuated by the high-voltage power supply VCS, the detection of the voltages on the sense bit lines SABL and SABLB is performed at high speed compared with the detection performed when the local sense amplifier LA is actuated by the low-voltage power supply VDD. When the driving circuits R1 and R2 are actuated by the high-voltage power supply VCS, the discharge of the global bit lines GBL<k> and GBLB<k> is performed at high speed compared with the discharge performed when the driving circuits R1 and R2 are actuated by the low-voltage power supply VDD.

The voltages on the sense bit lines SABL and SABLB amplified by the local sense amplifier LA are input to the driving circuits R1 and R2, respectively (time t4). When the voltage on the sense bit line SABL is input to the driving circuit R1, the voltage is inverted by the inverter including the P-ch transistor M28 and the N-ch transistor M29. An inverted voltage GBL_n of the voltage is input to the gate of the N-ch transistor M1. When the voltage on the sense bit line SABLB is input to the driving circuit R2, the voltage is inverted by the inverter including the P-ch transistor M30 and the N-ch transistor M31. An inverted voltage GBLB_n of the voltage is input to the gate of the N-ch transistor M2.

When the inverted voltages GBL_n and GBLB_n are input to the gates of the N-ch transistors M1 and M2, respectively, the global bit lines GBL<k> and GBLB<k> are discharged according to the inverted voltages GBL_n and GBLB_n. The potential on one of the global bit lines GBL<k> and GBLB<k> also drops according to the drop in the potential on one of the sense bit lines SABL and SABLB. The potentials on the global bit lines GBL<k> and GBLB<k> are input to the global sense amplifier GA and amplified by the global sense amplifier GA.

After the bit lines BL<i> an BLB<i>, the sense bit lines SABL and SABLB, and the global bit lines GBL<k> and GBLB<k> are pre-charged by the low-voltage power supply VDD, the local sense amplifier LA and the driving circuits R1 and R2 are actuated by the high-voltage power supply VCS. This makes it possible to realize an increase in speed of the local sense amplifier LA and the driving circuits R1 and R2 without increasing electric power consumed by the bit lines BL<i> and BLB<i>, the sense bit lines SABL and SABLB, and the global bit lines GBL<k> and GBLB<k>. Therefore, it is possible to improve readout operation speed while suppressing an increase in power consumption of an SRAM.

The P-ch transistors M16 and M17 are inserted between the bit lines BL<i> and BLB<i> and the sense bit lines SABL and SABLB. The bit lines BL<i> and BLB<i> and the sense bit lines SABL and SABLB are disconnected when the local sense amplifier LA is actuated. This makes it unnecessary to discharge the bit lines BL<i> and BLB<i> with the local sense amplifier LA. This makes it possible to reduce a load on the local sense amplifier LA when a signal read out from the memory cell MC is amplified by the local sense amplifier LA. Therefore, it is possible to realize an increase in speed of the operation of the local sense amplifier LA.

In the method explained in the embodiment, after the bit lines BL<i> and BLB<i>, the sense bit lines SABL and SABLB, and the global bit lines GBL<k> and GBLB<k> are pre-charged by the low-voltage power supply VDD, the local sense amplifier LA and the driving circuits R1 and R2 are actuated by the high-voltage power supply VCS. However, one of the local sense amplifier LA and the driving circuits R1 and R2 can be actuated by the high-voltage power supply VCS.

The method explained in the embodiment is applied to a hierarchical bit line structure in which the global bit lines GBL<k> and GBLB<k> are provided above the bit lines BL<i> and BLB<i>. However, the method can be applied to a single layer bit line structure in which the global bit lines GBL<k> and GBLB<k> are not provided above the bit lines BL<i> and BLB<i>.

In the method explained in the embodiment, the power supply for the local sense amplifier LA connected to the sense bit lines SABL and SABLB, which can be disconnected from the bit lines BL<i> and BLB<i>, is switched. However, a power supply for a sense amplifier directly connected to the bit lines BL<i> and BLB<i> can be switched.

Figure 4:
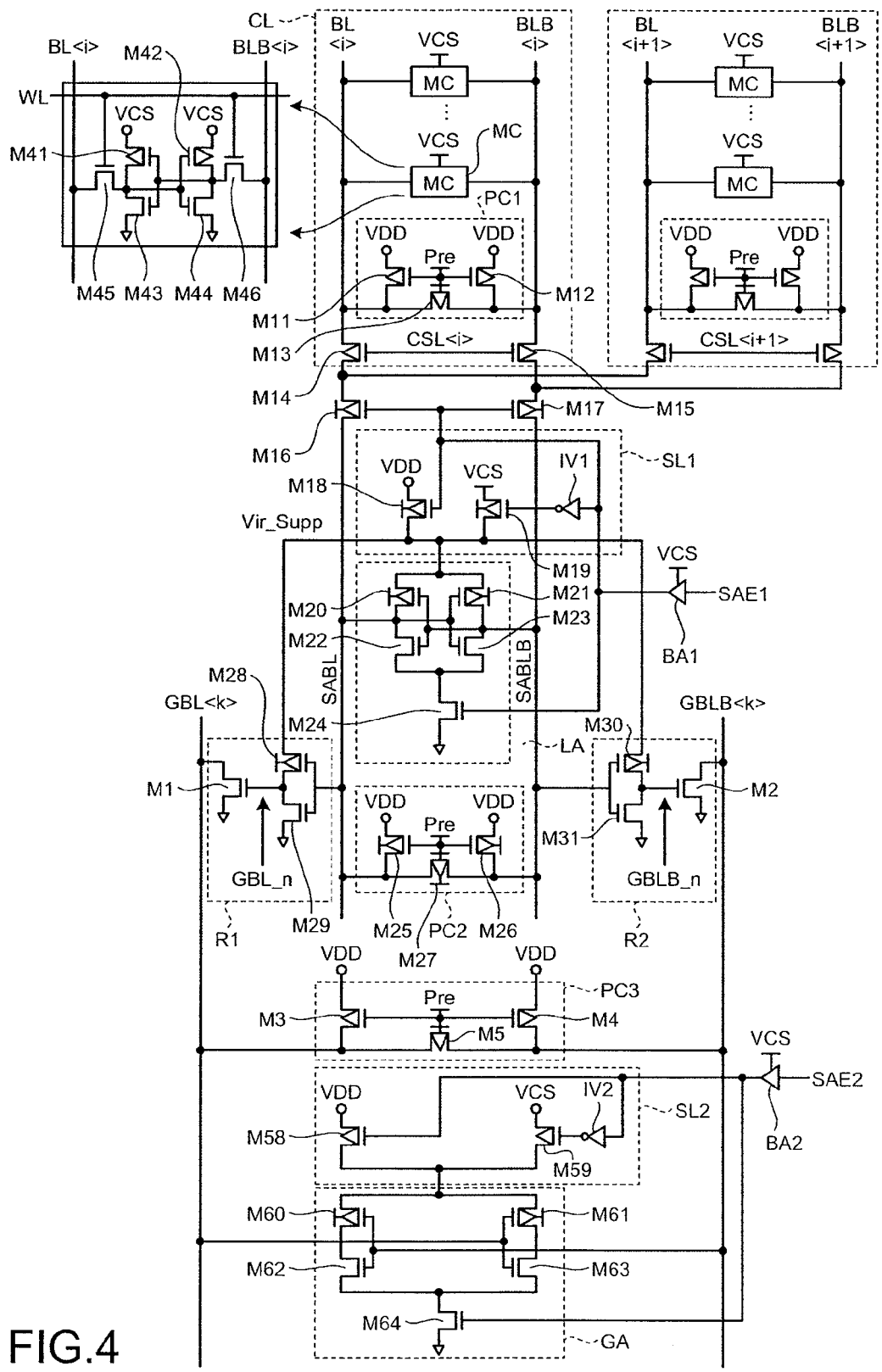
FIG. 4 is a block diagram of a schematic configuration of a semiconductor storage device according to a second embodiment of the present invention.

FIG. 4 is a block diagram of a schematic configuration of a semiconductor storage device according to a second embodiment of the present invention.

In FIG. 4, a power-supply-voltage switching circuit SL2 that switches, after the global bit lines GBL<k> and GBLB<k> are pre-charged by the pre-charge circuit PC3, the voltage of the power supply for actuating the global sense amplifier GA is provided in the semiconductor storage device in addition to the components shown in FIGS. 1 and 2.

P-ch transistors M60 and M61 and N-ch transistors M62 to M64 are provided in the global sense amplifier GA. The P-ch transistor M60 and the N-ch transistor M62 are connected in series and a gate of the P-ch transistor M60 and a gate of the N-ch transistor M62 are connected to each other to form an inverter. The P-ch transistor M61 and the N-ch transistor M63 are connected in series and a gate of the P-ch transistor M61 and a gate of the N-ch transistor M63 are connected to each other to form an inverter. An output of one of the pair of inverters is connected to an input of the other inverter to form a flip-flop.

The gate of the P-ch transistor M61, the gate of the N-ch transistor M63, a drain of the P-ch transistor M60, and a drain of the N-ch transistor M62 are connected to a global bit line GBL<k>. The gate of the P-ch transistor M60, the gate of the N-ch transistor M62, a drain of the P-ch transistor M61, and a drain of the N-ch transistor M63 are connected to the global bit line GBLB<k>. Sources of the N-ch transistors M62 and M63 are connected to a drain of the N-ch transistor M64.

The power-supply-voltage switching circuit SL2 can supply the low-voltage power supply VDD to the global sense amplifier GA when a sense amplifier enable signal SAE2 for allowing the operation of the global sense amplifier GA is off. The power-supply-voltage switching circuit SL2 can supply the high-voltage power supply VCS to the global sense amplifier GA when the sense amplifier enable signal SAE2 is on.

P-ch transistors M58 and M59 and an inverter IV2 are provided in the power-supply-voltage switching circuit SL2. The low-voltage power supply VDD is connected to a source of the P-ch transistor M58. The high-voltage power supply VCS is connected to a source of the P-ch transistor M59. Drains of the P-ch transistors M58 and M59 are connected to sources of the P-ch transistors M60 and M61.

The sense amplifier enable signal SAE2 is input to a gate of the P-ch transistor M58 and a gate of the N-ch transistor M64 via a buffer BA2. The sense amplifier enable signal SAE2 is input to a gate of the P-ch transistor M59 via the buffer BA2 and the inverter IV2.

Figure 5:
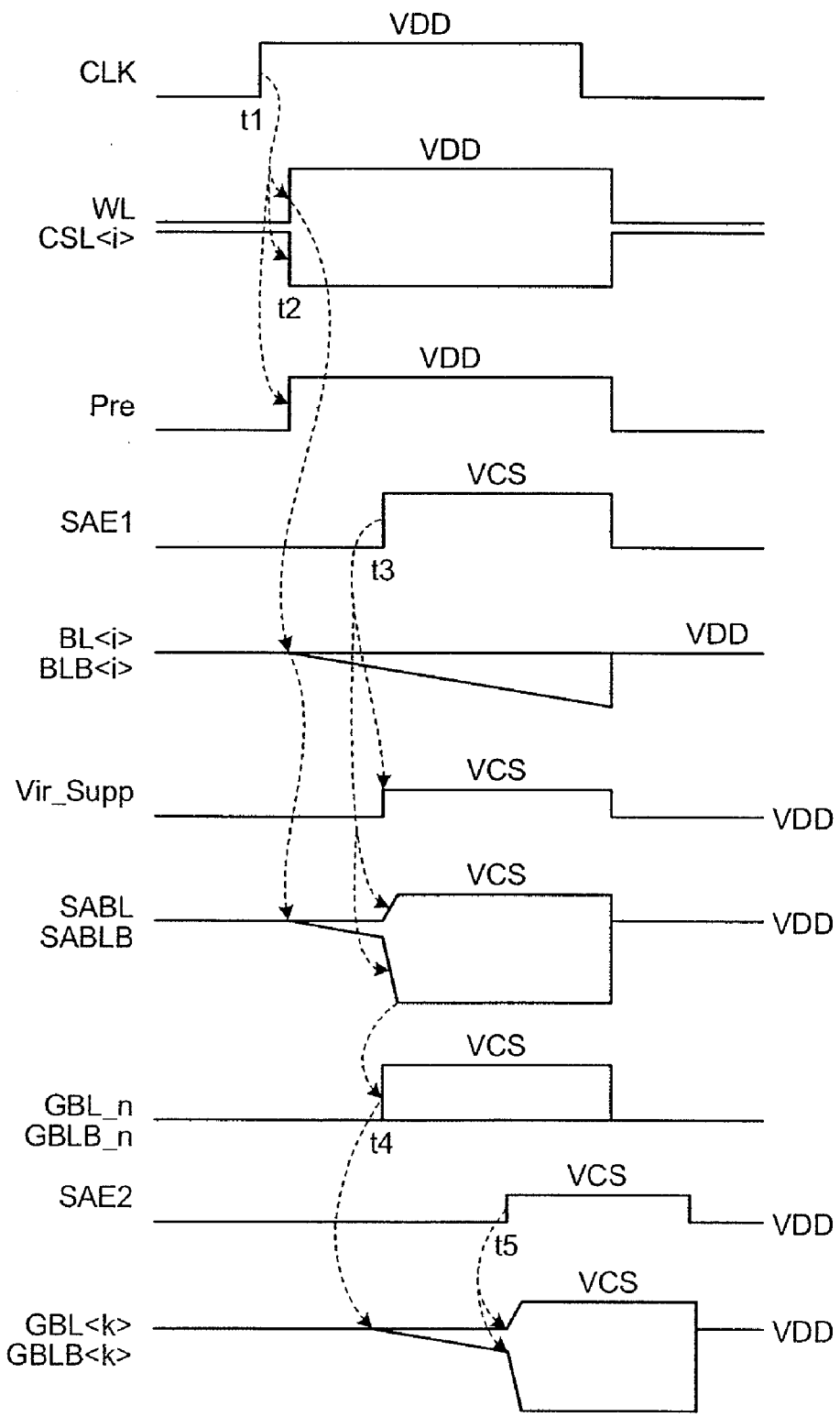
FIG. 5 is a timing chart of the operation of a local sense amplifier LA and a global sense amplifier GA shown in FIG. 4.

FIG. 5 is a timing chart of the operation of the local sense amplifier LA and the global sense amplifier GA shown in FIG. 4.

In FIG. 5, when the voltages on the sense bit lines SABL and SABLB amplified by the local sense amplifier LA are input to the driving circuits R1 and R2, respectively, the operation same as that shown in FIG. 3 is performed until the potential on one of the global bit lines GBL<k> and GBLB<k> also drops according to the drop in the potential on one of the sense bit lines SABL and SABLB (time t1 to t4).

Subsequently, for example, after the elapse of a predetermined time from the start of discharge of the global bit line GBLB<k>, the sense amplifier enable signal SAE2 changes from the low level to the high level (time t5). When the sense amplifier enable signal SAE2 changes from the low level to the high level, the N-ch transistor M64 is turned on and the global sense amplifier GA is actuated.

When the sense amplifier enable signal SAE2 changes from the low level to the high level, the P-ch transistor M58 is turned off, the sense amplifier enable signal SAE2 is inverted by the inverter IV2, and the P-ch transistor M59 is turned on. Therefore, a power supply for the P-ch transistors M60 and M61 is switched from the low-voltage power supply VDD to the high-voltage power supply VCS. The global sense amplifier GA is actuated by the high-voltage power supply VCS.

When the global sense amplifier GA is actuated by the high-voltage power supply VCS, the detection of the voltages on the global bit lines GBL<k> and GBLB<k> is performed at high speed compared with the detection performed when the global sense amplifier GA is actuated by the low-voltage power supply VDD.

This makes it possible to actuate the local sense amplifier LA, the driving circuits R1 and R2, and the global sense amplifier GA with the high-voltage power supply VCS after pre-charging the bit lines BL<i> and BLB<i>, the sense bit lines SABL and SABLB, and the global bit lines GBL<k> and GBLB<k> with the low-voltage power supply VDD. This also makes it possible to realize an increase in speed of the local sense amplifier LA, the driving circuits R1 and R2, and the global sense amplifier GA without increasing electric power consumed by the bit lines BL<i> and BLB<i>, the sense bit lines SABL and SABLB, and the global bit lines GBL<k> and GBLB<k>. Consequently, it is possible to improve readout operation speed while suppressing an increase in power consumption of an SRAM even when the hierarchical bit line structure is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
   a memory cell configured to store data;
   a sense amplifier configured to amplify a signal from the memory cell;
   a bit line configured to transmit the signal from the memory cell to the sense amplifier;
   a pre-charge circuit configured to pre-charge the bit line; and
   a power-supply-voltage switching circuit configured to switch a voltage of a power supply and to actuate the sense amplifier after the bit line is pre-charged by the pre-charge circuit, wherein the power-supply-voltage switching circuit is configured to switch the voltage of the power supply to be larger than a voltage during the pre-charge by the pre-charge circuit.

2. The semiconductor storage device of claim 1, wherein
   a high-voltage power supply is used for actuating the memory cell and the sense amplifier, and
   a low-voltage power supply is used for the pre-charge circuit.

3. The semiconductor storage device of claim 2, wherein the power-supply-voltage switching circuit is configured to supply the voltage to the sense amplifier during the pre-charge by the pre-charge circuit when a signal enabling the sense amplifier to operate is off and to supply a voltage larger than the voltage during the pre-charge to the sense amplifier when the signal enabling the sense amplifier is on.

4. A semiconductor storage device comprising:
   a memory cell configured to store data;
   a local sense amplifier configured to amplify a signal from the memory cell;
   a bit line configured to transmit the signal from the memory cell to the local sense amplifier;
   a first pre-charge circuit configured to pre-charge the bit line;
   a global bit line configured to transmit the signal amplified by the local sense amplifier;
   a second pre-charge circuit configured to pre-charge the global bit line;
   a global sense amplifier configured to amplify the signal transmitted by the global bit line;
   a driving circuit configured to drive the global bit line based on the signal amplified by the local sense amplifier; and
   a power-supply-voltage switching circuit configured to switch a voltage of a first power supply and to actuate the driving circuit after the global bit line is pre-charged by the second pre-charge circuit.

5. The semiconductor storage device of claim 4, wherein the power-supply-voltage switching circuit is configured to switch a voltage of a second power supply in order to actuate the local sense amplifier after the bit line is pre-charged by the first pre-charge circuit.

6. The semiconductor storage device of claim 5, wherein the power-supply-voltage switching circuit is configured to switch the voltages to be larger than a voltage during the pre-charge by the first pre-charge circuit.

7. The semiconductor storage device of claim 6, wherein
   a high-voltage power supply is used for actuating the memory cell and the local sense amplifier, and
   a low-voltage power supply is used for the first pre-charge circuit.

8. The semiconductor storage device of claim 7, wherein the power-supply-voltage switching circuit is configured to supply the voltage to the driving circuit and the local sense amplifier during the pre-charge by the first pre-charge circuit when a signal enabling the sense amplifier to operate the local sense amplifier is off and to supply a voltage larger than the voltage to the driving circuit and the local sense amplifier during the pre-charge by the first pre-charge circuit when the signal enabling the sense amplifier is on.

9. A semiconductor storage device comprising:
   a memory cell configured to store data;
   a local sense amplifier configured to amplify a signal from the memory cell;
   a bit line connected to the memory cell;
   a sense bit line configured to transmit the read signal to the local sense amplifier;
   a first pre-charge circuit configured to pre-charge the bit line;
   a second pre-charge circuit configured to pre-charge the sense bit line;
   a global bit line configured to transmit the signal amplified by the local sense amplifier;
   a third pre-charge circuit configured to pre-charge the global bit line;
   global sense amplifier configured to amplify the signal transmitted by the global bit line;
   a driving circuit configured to drive the global bit line based on the signal amplified by the local sense amplifier; and
   a power-supply-voltage switching circuit configured to switch a voltage of a first power supply and to actuate the local sense amplifier after the sense bit line is pre-charged by the second pre-charge circuit, wherein the power-supply-voltage switching circuit is configured to switch a voltage of a second power supply in order to actuate the driving circuit after the sense bit line is pre-charged by the second pre-charge circuit.

10. The semiconductor storage device of claim 9, wherein the power-supply-voltage switching circuit is configured to switch the voltage to be larger than a voltage during the pre-charge by the first pre-charge circuit.

11. The semiconductor storage device of claim 10, wherein
    a high-voltage power supply is used for actuating the memory cell and the local sense amplifier, and
    a low-voltage power supply is used for the first pre-charge circuit and the second pre-charge circuit.

12. The semiconductor storage device of claim 11, wherein the power-supply-voltage switching circuit is configured to supply the voltage to the local sense amplifier and the driving circuit during the pre-charge by the first pre-charge circuit when a signal enabling the sense amplifier to operate the local sense amplifier is off and to supply a voltage larger than the voltage to the local sense amplifier and the driving circuit during the pre-charge by the first pre-charge circuit when the signal enabling the sense amplifier is on.

13. The semiconductor storage device of claim 12, further comprising a field effect transistor configured to conduct the bit line and the sense bit line when the signal enabling sense amplifier to operate the local sense amplifier is off and to disconnect the bit line and the sense bit line when the signal enabling the sense amplifier is on.

14. The semiconductor storage device of claim 13, wherein
a cluster comprises a plurality of the memory cells in a column direction connected to a same bit line, and
the bit line of the cluster is connected to the sense bit line via a field effect transistor configured to select the cluster.

15. The semiconductor storage device of claim 14, wherein
a plurality of the clusters are in a row direction as a bank, and
the global bit line is in the column direction, common to a plurality of the banks.

16. The semiconductor storage device of claim 15, further comprising a global power-supply-voltage switching circuit configured to switch the voltage of the power supply in order to actuate the global sense amplifier to be larger than a voltage during the pre-charge by the third pre-charge circuit after the global bit line is pre-charged by the third pre-charge circuit.

17. The semiconductor storage device of claim 16, wherein the high-voltage power supply is used for actuating the global sense amplifier and the low-voltage power supply is used for the third pre-charge circuit.

18. The semiconductor storage device of claim 17, wherein the global power-supply-voltage switching circuit is configured to supply the voltage to the global sense amplifier during the pre-charge by the third pre-charge circuit when a signal enabling the global sense amplifier to operate is off and to supply a voltage larger than the voltage to the global sense amplifier during the pre-charge by the third pre-charge circuit when the signal enabling the global sense amplifier is on.

* * * * *